(12) United States Patent
Sugiyama et al.

(10) Patent No.: US 9,842,635 B2
(45) Date of Patent: Dec. 12, 2017

(54) SPIN TRANSISTOR MEMORY

(71) Applicant: Kabushiki Kaisha Toshiba, Minato-ku (JP)

(72) Inventors: Hideyuki Sugiyama, Kawasaki (JP); Mizue Ishikawa, Yokohama (JP); Tomoaki Inokuchi, Yokohama (JP); Yoshiaki Saito, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/063,808

(22) Filed: Mar. 8, 2016

(65) Prior Publication Data

US 2016/0276007 A1  Sep. 22, 2016

(30) Foreign Application Priority Data

Mar. 20, 2015 (JP) ................................ 2015-058763

(51) Int. Cl.
  *G11C 11/16* (2006.01)
  *G11C 11/15* (2006.01)
  (Continued)

(52) U.S. Cl.
  CPC .......... *G11C 11/161* (2013.01); *G11C 11/165* (2013.01); *H01L 29/66984* (2013.01); *H03K 19/18* (2013.01); *G11C 11/15* (2013.01)

(58) Field of Classification Search
  CPC ................. G11C 11/161; G11C 11/165; H01L 29/66984; H03K 19/18
  (Continued)

(56) References Cited

U.S. PATENT DOCUMENTS 6,275,411 B1 * 8/2001 Daughton .............. B82Y 10/00
              257/E27.005
7,411,235 B2   8/2008 Saito
              (Continued)

FOREIGN PATENT DOCUMENTS

JP    2006-32915 A    2/2006
JP    2009-110660 A   5/2009
              (Continued)

OTHER PUBLICATIONS

Satoshi Sugahara, et al., "Spin MOSFETs as a Basis for Spintronics" ACM Transactions on Storage, vol. 2, No. 2, May 2006, pp. 197-219.

*Primary Examiner* — Ly D Pham
(74) *Attorney, Agent, or Firm* — Oblon, McClelland, Maier & Neustadt, L.L.P.

(57) ABSTRACT

A spin transistor memory according to an embodiment includes: a first semiconductor region, a second semiconductor region, and a third semiconductor region, each being of a first conductivity type and disposed in a semiconductor layer; a first gate disposed above the semiconductor layer between the first semiconductor region and the second semiconductor region; a second gate disposed above the semiconductor layer between the second semiconductor region and the third semiconductor region; and a first ferromagnetic layer, a second ferromagnetic layer, and a third ferromagnetic layer disposed on the first semiconductor region, the second semiconductor region, and the third semiconductor region respectively.

19 Claims, 13 Drawing Sheets

(51) Int. Cl.
*H01L 29/66* (2006.01)
*H03K 19/18* (2006.01)

(58) Field of Classification Search
USPC .............................. 365/51, 63, 185.17, 158
See application file for complete search history.

(56) References Cited

U.S. PATENT DOCUMENTS

| | | | |
|---|---|---|---|
| 2003/0107915 | A1 | 6/2003 | Kim |
| 2005/0226071 | A1* | 10/2005 | Beers .................. G11C 11/15 365/209 |
| 2008/0175032 | A1* | 7/2008 | Tanaka .................. G11C 5/025 365/51 |
| 2009/0180215 | A1 | 7/2009 | Ishikawa |
| 2012/0250398 | A1* | 10/2012 | Morise ............... G11C 19/0841 365/157 |

FOREIGN PATENT DOCUMENTS

| | | |
|---|---|---|
| JP | 2009-170556 A | 7/2009 |
| JP | 2010-21291 A | 1/2010 |
| JP | 2010-34152 A | 2/2010 |

* cited by examiner

| MAGNETIZATION FREE LAYER | $22_1$ | $22_2$ | $22_3$ | $22_4$ |
|---|---|---|---|---|
| DIRECTION OF MAGNETIZATION | D | U | U | D |
| RESISTANCE VALUE | 1 | 1 | 0 | 1 |

FIG. 4

| MAGNETIZATION FREE LAYER | $22_1$ | $22_2$ | $22_3$ | $22_4$ |
|---|---|---|---|---|
| CORRESPONDING VALUE $Y_i$ | 1 | 0 | 0 | 1 |
| RESISTANCE VALUE $X_i$ | 1 | 1 | 0 | 1 |

FIG. 5

| Y | 1001 |
|---|---|
| X | 1101 |

FIG. 6

| Z | 1001 |
| Y | 1110 |
| X | 1001 |
| A | 1001 |

SPIN TRANSISTOR MEMORY

CROSS REFERENCE TO RELATED APPLICATIONS

This application is based upon and claims the benefit of priority from prior Japanese Patent Application No. 2015-058763 filed on Mar. 20, 2015 in Japan, the entire contents of which are incorporated herein by reference.

FIELD

Embodiments described herein relate generally to spin transistor memories.

BACKGROUND

Recently, research and development of spin electronics devices using the spin freedom of electrons has been actively performed. Studies based on tunnel magnetoresistance (TMR) effect are gaining vigor, and are now applied to magnetic random access memories (MRAMs) and reproducing heads of hard disk drives (HDDs).

MRAMs are expected as next-generation working memories required to fulfil the low-power-consumption demand since they are nonvolatile and can be written a great number of times. An MRAM includes magnetic tunnel junction (MTJ) elements in which a thin tunnel barrier is sandwiched between a magnetization fixed layer and a magnetization free layer. The MRAM is written by causing electric current to flow through the elements by spin transfer torque switching.

A spin-based MOSFET, which includes a ferromagnetic element and a metal-oxide-semiconductor field effect transistor (MOSFET), have both a memory function and a transistor function. Reconfigurable logic circuits including spin-based MOSFETs are proposed, in which the spin-based MOSFETs constitute basic logic gates such as AND gates and OR gates, and the connections of these basic logic gates can be changed by rewriting the magnetization states of the magnetic materials. The logical circuits of a reconfigurable logic circuit can be changed after the hardware is manufactured. Spin-based MOSFETs are expected to achieve low-power-consumption reconfigurable logic circuits.

In conventional working memories such as dynamic random access memories (DRAMs) and MRAMs, one memory cell includes one transistor and one memory element. In the DRAMs, the memory element is a capacitance. In the MRAMs, the memory element is a magnetic tunnel junction (MTJ) element.

The memory element may be made smaller than the transistor, and may be formed on the transistor. Therefore, the size of the memory cell is determined by the size of the transistor. Assuming that the minimum feature size in the process rule is Dmin, the minimum size of the memory cell is $6 \times \text{Dmin}^2$ due to the structure of the transistor.

If a memory is formed with conventional spin-based MOSFETs, in which the source and the drain are formed of a magnetization free layer with a ferromagnetic material and a magnetization pinned layer with a ferromagnetic material, the minimum size of the memory cell is $6 \times \text{Dmin}^2$. Thus, the integration degree of such a memory is the same as that of conventional working memories.

A spin-based MOSFET has a logic function of the transistor and a memory function obtained from the magnetoresistance effect. Conventional spin-based MOSFETs are perpendicularly integrated relative to the substrate. However, in the in-plane direction, the integration degree of the spin-based MOSFETs is about the same as that of the conventional working memories.

Thus, working memories including conventional spin-based MOSFETs do not have a greater advantage in integration than existing working memories.

BRIEF DESCRIPTION OF THE DRAWINGS

FIG. 4 is a diagram showing memory cell values in the cell string shown in FIG. 3.

FIG. 5 is a diagram showing the corresponding values and the resistance state values of the memory cells of the specific example shown in FIG. 3.

FIG. 6 is a diagram showing a relationship between a Gray code and a binary code in the cell string shown in FIG. 3.

DETAILED DESCRIPTION

Figure 1:
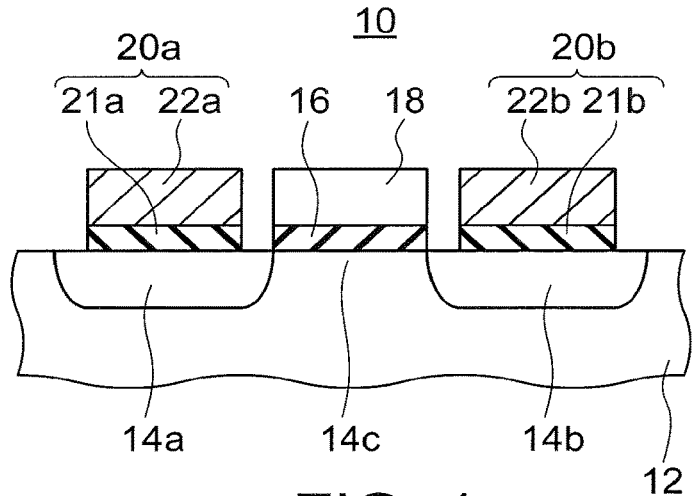
FIG. 1 is a cross-sectional view showing a memory element of a spin-based MOSFET according to a first embodiment.

A spin transistor memory according to an embodiment includes: a first semiconductor region, a second semiconductor region, and a third semiconductor region, each being of a first conductivity type and disposed in a semiconductor layer; a first gate disposed above the semiconductor layer between the first semiconductor region and the second semiconductor region;

a second gate disposed above the semiconductor layer between the second semiconductor region and the third semiconductor region; and a first ferromagnetic layer, a second ferromagnetic layer, and a third ferromagnetic layer disposed on the first semiconductor region, the second semiconductor region, and the third semiconductor region respectively.

Embodiments will be described in detail with reference to the accompanying drawings. It should be noted that the drawings are schematic, and the dimensions of each element, the magnitude of each voltage, the length of each period of time, the ratio among the sizes of elements, the ratio among voltage, and the time intervals as illustrated may be different from the actual ones. Furthermore, the same portion of the same element may be illustrated as having different sizes and different ratios in different drawings.

First Embodiment

A spin field effect transistor memory (hereinafter also referred to as "spin-based FET memory" or "spin transistor memory") according to a first embodiment will be described below. The first embodiment includes a memory element 10 shown in FIG. 1. The memory element 10 includes, for example, an n-type source 14a and an n-type drain 14b that are separately formed in a p-type semiconductor layer 12, a gate 18 formed above a portion of the semiconductor layer 12 between the source 14a and the drain 14b, the portion serving as a channel 14c, a gate insulating film 16 disposed between the channel 14c and the gate 16, and a source electrode 20a and a drain electrode 20b disposed on the source 14a and the drain 14b, respectively, the source electrode 20a and the drain electrode 20b including ferromagnetic layers. The source electrode 20a includes a magnetization free layer 22a, and the drain electrode 20b includes a magnetization free layer 22b, the magnetization directions of the magnetization free layer 22a and the magnetization free layer 22b are changeable. In the first embodiment, a nonmagnetic layer 21a is disposed between the magnetization free layer 22a and the source 14a, and a nonmagnetic layer 21b is disposed between the magnetization free layer 22b and the drain 14b. The semiconductor layer 12 may be a well region, or a silicon-on-insulator (SOI) layer of an SOI substrate, or a bulk substrate. Although no gate sidewall of an insulating material is formed at the side surface of the gate 18 in the memory element 10 shown in FIG. 1, the gate sidewall is preferably disposed as shown in FIG. 9, which will be described later, to prevent short-circuiting between the gate 18 and the source electrode 20a and between the gate 18 and the drain electrode 20b.

The magnetization free layer 22a and the magnetization free layer 22b have magnetic anisotropy, so that the directions of magnetization of these magnetization free layers always become parallel to or antiparallel to each other. Thus, the directions of magnetization of these magnetization free layers are always in one of the parallel state and the antiparallel state. The parallel state may include a substantially parallel state in which the directions of magnetization may be slightly shifted from those of the perfectly parallel state. The antiparallel state may include a substantially antiparallel state in which the directions of magnetization are slightly shifted from those of the perfectly antiparallel state.

The memory element 10 of the first embodiment includes a thin conductive layer serving as the channel 14c, through which electrons with spin flow between the magnetization free layer 22a and the magnetization free layer 22b. The well region under the channel shown in FIG. 1 is formed as a semiconductor of a type opposite to the type of the semiconductor of the drain and the source. If the source and the drain are formed as an n-type semiconductor, the well is formed as a p-type semiconductor, and if the source and the drain are formed as a p-type semiconductor, the well is formed as an n-type semiconductor. In the first embodiment, the well is formed as a p-type semiconductor, and the source and the drain are formed as an n-type semiconductor. The nonmagnetic layers 21a, 21b are formed as, for example, magnesium oxide. The nonmagnetic layers 21a, 21b will serve as tunnel barriers.

In the first embodiment, the semiconductor layer 12 is formed of silicon doped with boron at a low concentration, the magnetization free layers 22a, 22b are formed of cobalt and iron alloy, the gate 18 is formed of polycrystalline silicon, and the gate insulating film 16 is formed of silicon dioxide. The source 14a and the drain 14b are formed of silicon doped with phosphorus and arsenic impurities at a high concentration.

In the first embodiment, voltage is applied to the gate 18 to form an inversion layer at an interface between the semiconductor layer 12 and the gate insulating film 16. The inversion layer serves as the electrically conductive channel 14c. After this, electron current that flows in a direction opposite to electric current flows from one of the magnetization free layer 22a and the magnetization free layer 22b, for example, from the magnetization free layer 22a to the magnetization free layer 22b, through the tunnel barrier 21a, the source 14a, the channel 14c, the drain 14b, and the tunnel barrier 21b. As a result, electrons that are spin-polarized in the magnetization free layer 22a are injected into the source 14a via the tunnel barrier 21a and are accumulated, and then also are injected into the drain 14b via the channel 14c. The spin-polarized electrons that are injected into the drain 14b move toward the magnetization free layer 22b via the tunnel barrier 21b. For the spin-polarized electrons in the magnetization free layer 22a majority spin is parallel to the magnetization of the magnetization free layer 22a, and minority spin is antiparallel to the magnetization of the magnetization free layer 22a. The spin-polarized electrons moving toward the magnetization free layer 22b may pass the magnetization free layer 22b if they have spin parallel to the magnetization of the magnetization free layer 22b, but may be reflected at the interface with the magnetization free layer 22b if they have spin antiparallel to the magnetization free layer 22b. Therefore, if the magnetization of the magnetization free layer 22a and the magnetization of the magnetization free layer 22b are parallel to each other, large electric current flows through the magnetization free layer 22b, but if they are antiparallel to each other, small electric current flows. The orientation of the spin of the electrons spin-polarized by the magnetization free layer 22a, i.e., whether the magnetization direction of the magnetization free layer 22a and the magnetization direction of the magnetization free layer 22b are parallel or antiparallel to each other, may be detected by judging the degree of the electric current flowing through the magnetization free layer 22b.

The first embodiment has a gate structure in which the gate insulating film 16 is formed on the top surface of the semiconductor layer 12, and the gate 18 is formed on the gate insulating film 16. However, a recessed gate structure may also be employed, in which a groove is formed in the semiconductor layer 12 between the source 14a and the drain 14b, the gate insulating film 16 is formed on the bottom and the side surface of the groove, and the gate is formed on the gate insulating film 16.

In the first embodiment, the source 14a, the nonmagnetic layer 21a, and the magnetization free layer 22a may collectively be referred to as a source portion, the drain 14b, the nonmagnetic layer 21b, and the magnetization free layer 22b may collectively be referred to as a drain portion, and the channel 14c, the gate insulating film 16, and the gate 18 may collectively be referred to as a gate portion.

Figure 2:
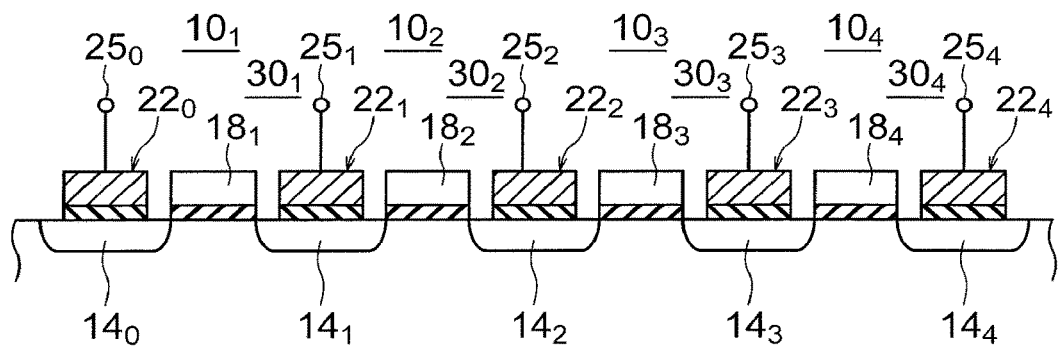
FIG. 2 is a cross-sectional view showing a cell string of the spin-based MOSFETs according to the first embodiment.

The spin-based FET memory according to the first embodiment includes at least one cell string with at least two memory elements 10 shown in FIG. 1, which are connected in series. Adjacent two memory elements in the cell string share the same region as a source or drain. FIG. 2 shows this cell string. A region including a gate portion and a drain portion of each memory element in the cell string is referred to as a memory cell. The cell string shown in FIG. 2 includes four memory elements $10_1$-$10_4$. A memory element $10_i$ (i=1, ..., 4) has an impurity region (semiconductor region) $14_{i-1}$ to serve as a source, in which impurities are doped at a high concentration, an impurity region (semiconductor region) $14_i$ to serve as a drain, in which impurities are doped at a high concentration, a magnetization free layer $22_{i-1}$ formed on the impurity region $14_{i-1}$, a magnetization free layer $22_i$ formed on the impurity region $14_i$, and a gate $18_i$ disposed on the channel between the impurity region $14_{i-1}$ and the impurity region $14_i$. The impurity region $14_i$ to serve as the drain of the memory element $10_i$ (i=1, ..., 3) is the same region as the source of the memory element $10_{i+1}$. Thus, the drain of the memory element $10_i$ (i=1, ..., 3) and as the source of the memory element $10_{i+1}$ share the same region. The gate portion including the gate $18_i$ of the memory element $10_i$ (i=1, ..., 4) and the drain portion including the magnetization free layer $22_i$ and the impurity region $14_i$ to serve as the drain constitute the memory cell $30_i$. The memory cells $30_1$-$30_4$ are connected in series. Thus, the cell string includes the source portion including the source $14_0$ and the magnetization free layer $22_0$, and the memory cells $30_1$, $30_2$, $30_3$, $30_4$ connected in series.

Although the first embodiment includes four memory cells, the number of memory cells may be arbitrarily selected as long as it is two or more.

In the cell string shown in FIG. 2, the direction of magnetization of the magnetization free layer $22_0$ is not switched, or if it reverses, the direction is recorded. Therefore, the direction of magnetization of the magnetization free layer $22_0$ is known, and represented by "U." If the direction of magnetization of any of the magnetization free layers $22_i$ (i=1, ..., 4) is parallel to the direction "U" of magnetization of the magnetization free layer $22_0$, the directing of magnetization of this magnetization free layer $22_i$ is "U". If the direction of magnetization of any of the magnetization free layers $22_i$ (i=1, ..., 4) is antiparallel to the direction "U" of magnetization of the magnetization free layer $22_0$, the direction of magnetization of this magnetization free layer is represented by "D".

In FIG. 2, a terminal $25_i$ is connected to each magnetization free layer $22_i$ (i=0, ..., 4). A terminal $25_{i-1}$ (i=1, ..., 4) and the terminal $25_i$ are electrically connected to each other by controlling voltage applied to the gate $18_i$ between the terminal $25_{i-1}$ and the terminal $25_i$, and the value of resistance $R_i$ between the terminal $25_{i-1}$ and the terminal $25_i$ is read.

If the direction of magnetization of the magnetization free layer $22_i$ (i=1, ..., 4) is parallel to that of the magnetization free layer $22_{i-1}$, the value of the resistance $R_i$ becomes low. If the direction of magnetization of the magnetization free layer $22_i$ (i=1, ..., 4) is antiparallel to that of the magnetization free layer $22_{i-1}$, the value of the resistance $R_i$ becomes high. The resistance state value of the resistance $R_i$ (i=1, ..., 4) is represented by "$X_i$". If the resistance $R_i$ (i=1, ..., 4) has a low value, the state is represented by $X_i=0$, and if it has a high value, the state is represented by $X_i=1$.

Figure 3:
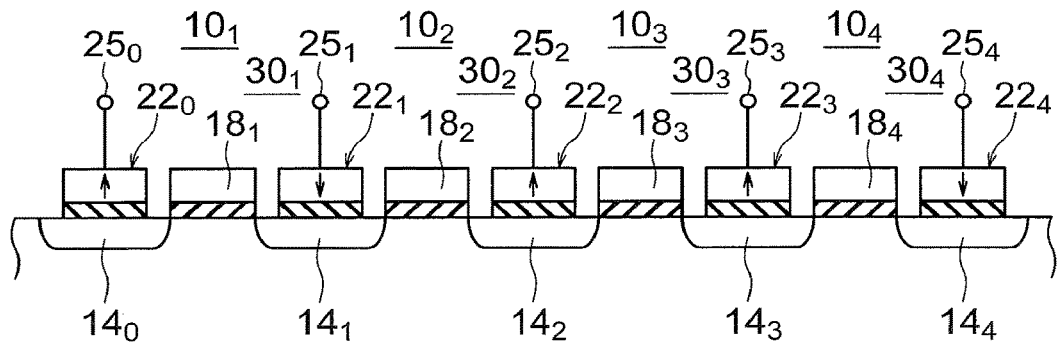
FIG. 3 is a diagram showing a specific example of magnetization directions of magnetization free layers in the first embodiment.

FIG. 3 shows a specific example of the directions of magnetization of the magnetization free layers $22_0$-$22_4$. The direction "U" of magnetization in the magnetization free layer $22_i$ (i=1, ..., 4) is indicated by an up arrow, and the direction "D" of magnetization is indicated by a down arrow. In the first embodiment and the second embodiment that will be described later, the magnetization free layers $22_0$-$22_4$ have a magnetic anisotropy perpendicular to the film plane. The film plane herein means a plane perpendicular to the stacking direction of the magnetization free layer, and the top surface thereof, for example.

Although a ferromagnetic material is used to form a perpendicular magnetization film in which the magnetization direction is perpendicular to the film plane in the first embodiment, it may be used to form an in-plane magnetization film in which the magnetization direction is parallel to the film plane.

In the specific example shown in FIG. 3, the directions of magnetization of the magnetization free layer $22_1$ and the magnetization free layer $22_4$ are "D", and these of the magnetization free layer $22_2$ and the magnetization free layer $22_3$ are "U." Whether the directions of magnetization of adjacent magnetization free layers $22_{i-1}$ (i=1, ..., 4) and $22_i$ are parallel or antiparallel to each other may be determined by the resistance state value $X_i$ known from the resistance value between the adjacent magnetization free layers. Thus, the relative directions of magnetization of adjacent two magnetization free layers may be known from the resistance state value $X_i$ (i=1, ..., 4).

FIG. 4 shows the resistance state values $X_i$ (i=1, ..., 4) in the specific example shown in FIG. 3. As shown in FIG. 4, the direction of magnetization of the magnetization free layer $22_i$ (i=1, ..., 4) does not match the resistance state value X. If the direction of magnetization of the magnetization free layer $22_{i-1}$ (i=1, ..., 4) is known, the direction of magnetization of the magnetization free layer $22_i$ may be obtained from the resistance state value X. Assuming that i is an integer from 1 to 4, if the resistance state value $X_i$ is 0, the direction of magnetization of the magnetization free layer $22_i$ becomes the same as the direction of magnetization of the magnetization free layer $22_{i-1}$. If the resistance state value $X_i$ is 1, the direction of magnetization of the magnetization free layer $22_i$ is opposite (antiparallel) to the direction of magnetization of the magnetization free layer $22_{i-1}$.

If the directions of magnetization of the four magnetization free layers $22_1$ to $22_4$ are unknown, all of these may be obtained by obtaining the four resistance state values $X_1$ to $X_4$.

A binary number "1" is assigned to the direction "D" of magnetization of the magnetization free layer $22_i$ (i=1, ..., 4), and a binary number "0" is assigned to the direction "U" of magnetization. The assigned value is referred to as $Y_i$ corresponding to the direction of magnetization of the magnetization free layer $22_i$.

FIG. 5 shows the corresponding values $Y_i$ and the resistance state values $X_i$ of the memory cells $30_i$ (i=1, ..., 4) of the specific example shown in FIG. 3, with "i" representing "i-th" from the magnetization free layer $22_0$, of which the direction of magnetization is known.

The binary number of the resistance state value $X_i$ of the i-th (i=1, ..., 4) memory cell $30_i$ counted from the magnetization free layer $22_0$, the direction of magnetization of which is known, is assumed to be the number of the i-th bit of the resistance state value, and the binary number of the corresponding value $Y_i$ of the magnetization free layer $22_i$ is assumed to be the number of the i-th bit of the corresponding value. The corresponding values $Y_1$-$Y_4$ corresponding to the directions of magnetization of the magnetization free layers $22_1$-$22_4$ are arranged in a line to form a binary number, which is assumed to be a memory value Y representing the directions of magnetization. The corresponding value $Y_1$ is assumed to be the most significant bit. The resistance state values $X_1$-$X_4$ are arranged in a line to form a binary number, which is assumed to be a memory value X of the resistance state values. The resistance state value $X_1$ is assumed to be the most significant bit.

FIG. 6 shows the memory value Y of the directions of magnetization and the memory value X of the resistance state values of the specific example shown in FIG. 3. As can be understood from FIG. 6, the memory value Y of the directions of magnetization is a Gray code of the memory value X of the resistance state values. Therefore, a Gray-to-binary (G-B) conversion for converting a Gray code into a binary code is performed to convert the memory value X of the resistance state values into the memory value Y of the directions of magnetization.

The G-B conversion can be performed by the following operation.

$$Y_1 = X_1$$

$$Y_i = Y_{i-1} \text{ EOR } X_i \ (i=2,\ldots,4)$$

where EOR is an exclusive OR, and $Y_i$ is obtained by the exclusive OR of $Y_{i-1}$ and $X_i$.

Thus, if i is an integer from 2 to 4,
$Y_i=0$ if $Y_{i-1}=0$ and $X_i=0$,
$Y_i=1$ if $Y_{i-1}=0$ and $X_i=1$,
$Y_i=1$ if $Y_{i-1}=1$ and $X_i=0$, and
$Y_i=0$ if $Y_{i-1}=1$ and $X_i=1$.

After a resistance state value $X_i$ (i=1, ..., 4) is determined, an output $X_i$ is outputted in parallel. A G-B conversion is performed to the output $X_i$, and an output $Y_i$ is outputted. The output $Y_i$ is the corresponding value $Y_i$ of the direction of magnetization.

Figure 7:
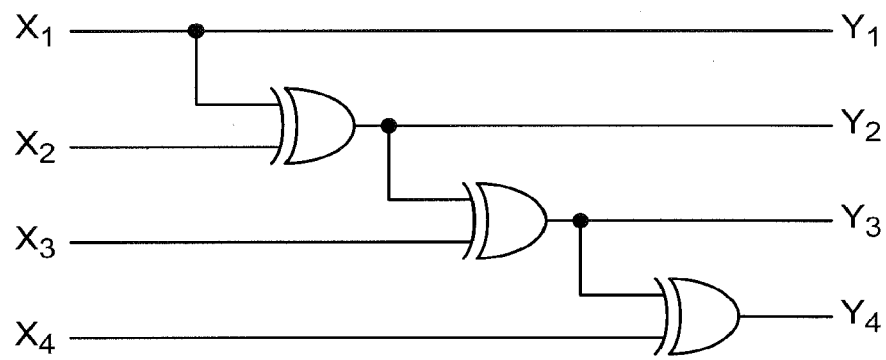
FIG. 7 is a diagram showing an example of a conversion circuit configured to convert a Gray code to a binary code.

FIG. 7 is a circuit diagram for obtaining the output $Y_i$ from the output $X_i$ (i=1, ..., 4). As shown in FIG. 7, a 4-bit binary code is outputted from a 4-bit Gray code through three exclusive OR operations. An N-bit Gray code, N being a natural number, may generally be converted to an N-bit binary code by N-1 exclusive OR operations. The G-B conversion is performed with N-1 exclusive OR operations for N memory cells. This G-B conversion is operated in the preceding part of the output that the chip containing the spin-based FET memories outputs a signal. Since only the circuit of N-1 exclusive OR are added in one chip, the area of the circuits to be added is very small relative to the entire chip area.

(Write Method)

An example of a write method for writing data to a memory cell will be described below with reference to FIGS. 8 and 9A. Spin transfer torque switching is performed to write data to each memory cell. Gate sidewalls $19_i$, i being a natural number, are formed on side surfaces of the gate $18_i$ of each memory cell as shown in FIG. 9A. The nonmagnetic layer (tunnel barrier) between the magnetization free layer and the impurity region is not illustrated in FIG. 9A.

Figure 8:
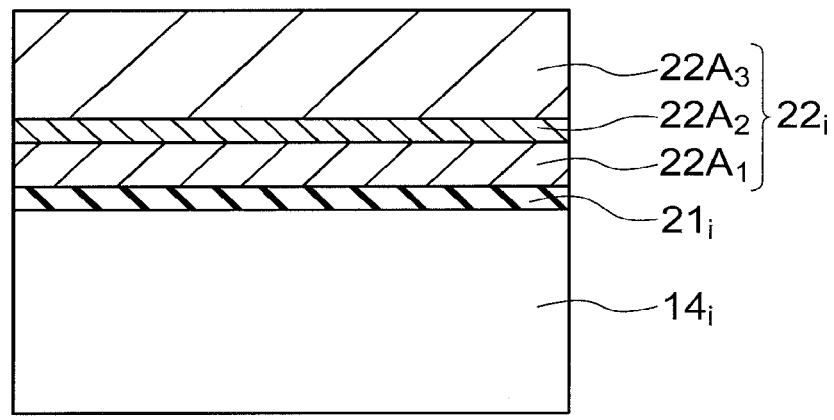
FIG. 8 is a cross-sectional view of a magnetization free layer for explaining a write method for the cell string shown in FIG. 3.
Figure 9A:
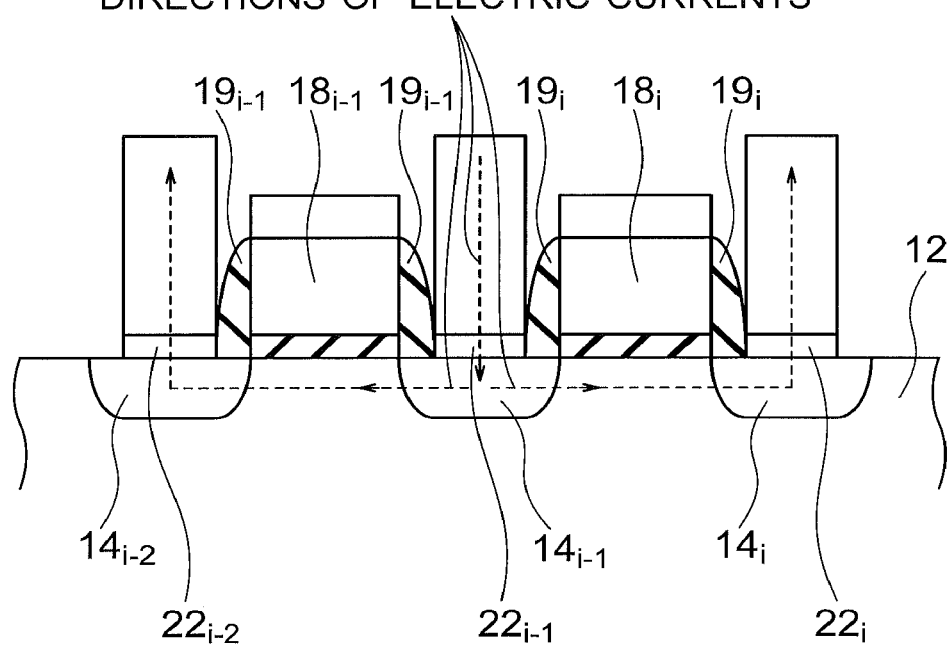
FIG. 9A is an explanatory diagram illustrating an example of the write method for the cell string shown in FIG. 3.

As shown in FIG. 8, each magnetization free layer $22_i$ (i is a natural number) has a multilayer structure including a ferromagnetic layer $22A_1$, a nonmagnetic layer $22A_2$, and a ferromagnetic layer $22A_3$ to have the current-perpendicular-to-plane giant magnetoresistance (CPP-GMR) effect. For example, the ferromagnetic layer $22A_1$ is formed of CoFe, the nonmagnetic layer $22A_2$ is formed of copper, and the ferromagnetic layer $22A_3$ is formed of CoFe. The ferromagnetic layer $22A_1$ is in contact with a multilayer structure including a tunnel barrier $21_i$ and an impurity region $14_i$. The ferromagnetic layer $22A_3$ is thicker than the ferromagnetic layer $22A_1$.

The magnetization of the ferromagnetic layer $22A_1$ reverses by spin transfer torque switching, when electric current by which spin-polarized electrons are injected into the ferromagnetic layer $22A_1$ is passed from the ferromagnetic layer $22A_1$ to the ferromagnetic layer $22A_3$ via the nonmagnetic layer $22A_2$, (electrons flow from the ferromagnetic layer $22A_3$ to the ferromagnetic layer $22A_1$). In the case that positive current is defined as electric current flowing from the ferromagnetic layer $22A_3$ to the ferromagnetic layer $22A_1$, negative electric current is passed when the direction of magnetization of the ferromagnetic layer $22A_1$ is to be made parallel to that of the ferromagnetic layer $22A_3$, and positive electric current is passed when the direction of magnetization of the ferromagnetic layer $22A_1$ is to be made antiparallel to that of the ferromagnetic layer $22A_3$. The magnetization of the ferromagnetic layer $22A_3$ does not reverse since it is greater in volume than the ferromagnetic layer $22A_1$.

In the case that the magnetization of the ferromagnetic layer $22A_1$ in the magnetization free layer $22_{i-1}$ (i is a natural number) reverses, predetermined voltage is applied to the gates $18_{i-1}$, $18_i$, and then electric current flows from the magnetization free layer $22_{i-1}$ to the magnetization free layer $22_{i-2}$ and the magnetization free layer $22_i$. As indicated by arrows in FIG. 9A, the electric current flowing through the magnetization free layer $22_{i-1}$ flows into the impurity region $14_{i-1}$ that is in contact with the magnetization free layer $22_{i-1}$, and is branched to two electric current paths in the impurity region $14_{i-1}$. One of the two electric current paths extends to the magnetization free layer $22_{i-2}$ through the channel that is immediately below the gate $18_{i-1}$ and the impurity region $14_{i-2}$, and the other extends to the magnetization free layer $22_i$ through the channel that is immediately below the gate $18_i$ and the impurity region $14_i$.

Since the electric current is branched to two electric current paths flowing to the two magnetization free layers $22_{i-2}$, $22_i$, the electric current flowing through the magnetization free layer $22_{i-2}$ is lower than the electric current flowing through the magnetization free layer $22_{i-1}$. Similarly, the electric current flowing through the magnetization free layer $22_i$ is lower than the electric current flowing through the magnetization free layer $22_{i-1}$. Thus, the magnetization of the magnetization free layer $22_{i-2}$ and the magnetization free layer $22_i$ may not reverse, but only the magnetization of the magnetization free layer $22_{i-1}$ may reverse if the value of the electric current is controlled in such a manner that the value of the spin-polarized current flowing through magnetization free layer $22_{i-1}$ is higher than the value at which the magnetization reversal is caused, and the value of the electric current flowing through the magnetization free layer $22_{i-2}$ is lower than the value at which magnetization reversal is caused, and the value of the electric current flowing through the magnetization free layer $22_i$ is lower than the value at which the magnetization reversal is caused. The memory cell is written in this manner.

In the first embodiment, the ferromagnetic layer $22A_3$ is thicker than the ferromagnetic layer $22A_1$. Because of this, the magnetization of the ferromagnetic layer $22A_3$ is not switched. However, an antiferromagnetic material may be disposed to be in contact with the ferromagnetic layer $22A_3$ to pin the magnetization of the ferromagnetic layer $22A_3$.

Furthermore, although the nonmagnetic layer $22A_2$ is formed of copper in the first embodiment, it may be formed of silver, gold, or chromium.

The nonmagnetic layer $22A_2$ of the first embodiment includes a single metal layer. However, it may be formed of an insulating material containing filament metal to form the magnetization free layer as the current-confined-path type of CPP-GMR.

A further example of the write method, in which the magnetization of the magnetic layer of the selected magnetization free layer reverses, will be described below. The write method described with reference to FIG. 9A is caused by write current to flow through a magnetization free layer that is next to the selected magnetization free layer.

In the further example, however, write current flows from a selected magnetization free layer to a second magnetization free layer counted from the selected magnetization free layer. This further example may suppress the influence of spin-dependent transfer between the magnetization free layers. Since this further example may suppress the spin transfer between adjacent magnetization free layers, variations in the threshold value of the write current depending on the directions of magnetizations in the adjacent magnetization free layers. This further example will be described with reference to FIG. 9B.

Figure 9B:
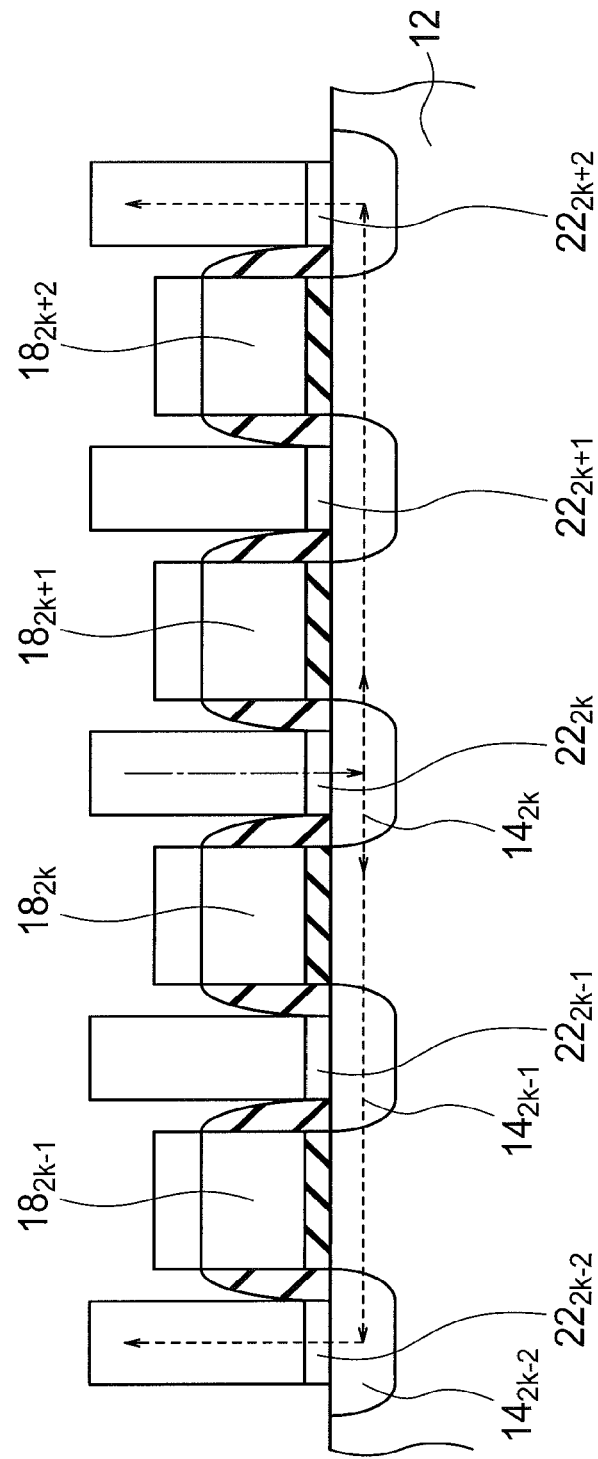
FIG. 9B is an explanatory diagram illustrating a further example of the write method for the cell string shown in FIG. 3.

FIG. 9B shows magnetization free layers having each a GMR structure as shown in FIG. 8, or a TMR structure having a thin tunnel barrier. FIG. 9B shows a flow of current in a case where a magnetization free layer $22_{2k}$ (k is a natural number) is selected, and write current with spin transfer torque switching flows through the magnetization free layer $22_{2k}$. The write current flows from the magnetization free layer $22_{2k}$ to a drain $14_{2k}$ adjacent to the magnetization free layer $22_{2k}$, and is branched in the drain $14_{2k}$. Most of the branched write current flow into a magnetization free layer $22_{2k-2}$ and a magnetization free layer $22_{2k+2}$. The spin transferred along the current path indicated by left-pointing arrows shown in FIG. 9B is relaxed during the transfer of electrons in this path since the distance between the magnetization free layer $22_{2k-2}$ and the magnetization free layer $22_{2k}$ is long. The spin transferred along a current path indicated by right-pointing arrows in FIG. 9B is also relaxed during the transfer of electrons in this path since the distance between the magnetization free layer $22_{2k}$ and the magnetization free layer $22_{2k+2}$ is long. As described above, the influence of spin-dependent transfer between adjacent magnetization free layers may be suppressed by employing a long distance for the transfer.

Figure 9C:
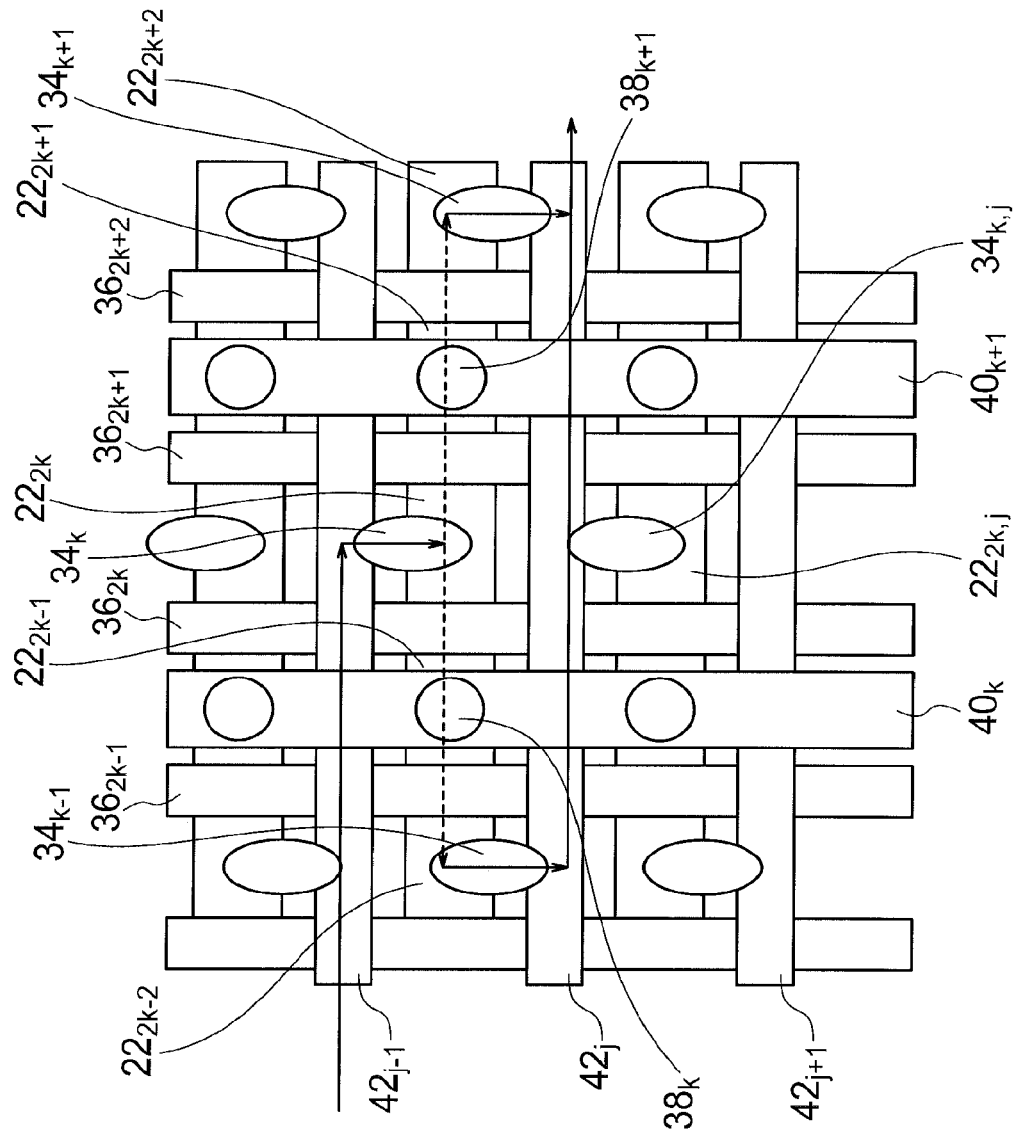
FIG. 9C is a top view of a memory cell array to which the further example of the write method is applied.

FIG. 9C is a top view of a spin-based MOSFET in which a plurality of cell strings according to the first embodiment are arranged in a row direction.

As shown in FIG. 9C, word lines $40_k$, $40_{k+1}$ are arranged in a row direction, and bit lines $42_{j-1}$, $42_j$, $42_{j+1}$ are arranged in a column direction, where k and j are natural numbers. The word lines $40_k$, $40_{k+1}$ cross the bit lines $42_{j-1}$, $42_j$, $42_{j+1}$.

In FIG. 9C, a magnetization free layer $22_{2k-2}$ of an even-numbered (2k−2) memory cell $30_{2k-2}$ in a cell string in a j-th row is connected to a bit line $42_j$ via a contact $34_{k-1}$, where k and j are natural numbers. The 0-th memory cell $30_0$ includes the impurity region $14_0$ and the magnetization free layer $22_0$ shown in FIG. 3. A magnetization free layer $22_{2k-1}$ of an odd-numbered memory cell $30_{2k-1}$ is connected to the word line $40_k$ via a contact $38_k$. In order to reduce the wiring resistance, a gate line $36_{2k}$ is disposed immediately above the gate $18_{2k}$ of each memory cell $30_{2k}$, and a gate line $36_{2k+1}$ is disposed immediately above the gate $18_{2k+1}$ of each memory cell $30_{2k+1}$. The gates may be formed of a metal so that the gates and the gate lines may be formed integrally.

Although the magnetization free layers of even-numbered memory cells are connected to the bit lines and the magnetization free layers of odd-numbered memory cells are connected to the word lines in this embodiment, the magnetization free layers of even numbered memory cells may be connected to the word lines, and the magnetization free layers of odd-numbered memory cells may be connected to the bit lines.

In the case that write current that may suppress the influence of the spin-dependent transfer flows, the connection of the bit line contact $34_k$ differs from that of other embodiment, as shown in FIG. 9C. In order to pass current from the magnetization free layer $22_{2k}$ to the magnetization free layer $22_{2k-2}$ and the magnetization free layer $22_{2k+2}$, the bit line contact $34_k$ connects to the bit line $42_{j-1}$, and the bit line contact $34_{k-1}$ and the bit line contact $34_{k+1}$ connect to the bit line $42_j$. The bit line $42_j$ in FIG. 9C has a bit line contact $34_{k,j}$ connecting to the magnetization free layer $22_{2k,j}$ disposed below in FIG. 9C, and a bit line contact $34_{k+1}$ connecting to the magnetization free layer $22_{2k+2}$ disposed above in FIG. 9C. As described above, the bit line contacts connecting to the bit line disposed above and the bit line contacts connecting to the bit line disposed below are alternately arranged. This bit line contact arrangement allows write current to flow from a selected magnetization free layer to second magnetization free layers counted from the selected magnetization free layer, thereby suppressing the influence of the spin-dependent transfer among the magnetization free layers.

In order to pass write current from the selected magnetization free layer to the second magnetization free layers counted from the selected magnetization free layer, voltage is applied to the gate line $36_{2k-1}$ and the gate line $36_{2k}$ so that current flows between the magnetization free layer $22_{2k}$ and the magnetization free layer $22_{2k-21}$ and voltage is applied to the gate line $36_{2k+1}$ and the gate line $36_{2k+2}$ so that current flows between the magnetization free layer $22_{2kx}$ and the magnetization free layer $22_{2k+2}$. Furthermore, voltage $V_{j-1}$ is applied to the bit line $42_{j-1}$, and voltage $V_j$ is applied to the bit line $42_j$ and then write current to flow between the bit line $42_{j-1}$ and the bit line $42_j$.

Passing write current in this manner, the spin transfer among adjacent magnetization free layers may be suppressed. Variations in the threshold value of the write current depending on the directions of magnetizations in magnetization free layers next to the selected magnetization free layer may be suppressed in this manner.

The write operation is performed by a control circuit 300 via a row decoder 210 and a column decoder 220 shown in FIG. 12, which will be described later.

The write method described with reference to FIGS. 9A to 9C is performed by the control circuit 300 in the following manner. An i-th (1≤i≤n−1) ferromagnetic layer is selected from a first to n-th ferromagnetic layers of one cell string, branched write current flows from the selected i-th ferromagnetic layer to one of the first to (i−1)-th ferromagnetic layers via an i-th semiconductor region, and another branched write current flows from the i-th ferromagnetic layer to one of the (i+1)-th to n-th ferromagnetic layers via the i-th semiconductor region.

(Read Method)

As will be described in the descriptions of the second embodiment later, a cell string according to the first embodiment is read in two steps. First, data is read from, for example, odd-numbered memory cells and stored. Thereafter, data from even-numbered memory cells is read, and combined with the data of the odd-numbered memory cells previously read. The details will be described in the descriptions of the second embodiment.

Although only one G-B conversion circuit is implemented on the memory chip in the first embodiment, a plurality of G-B conversion circuits may be implemented so that one G-B conversion circuit is disposed for each memory bank including a plurality of cell strings.

Although the resistance state value $X_i$ (i=1, . . . , 4) is 0 when the resistance is a low value, and is 1 when the resistance is a high value in the first embodiment, it may be 0 when the resistance is a high value, and 1 when the resistance is a low value.

Although a spin-based MOSFET having a MOSFET structure is employed in the first embodiment, a spin-based FET (spin-based field effect transistor) having a MISFET structure, or a HEMT structure may also be employed.

The nonmagnetic layer $21_i$ disposed between the magnetization free layer $22_i$ (i=0, . . . , 4) and the impurity region $14_i$ in the memory element of the first embodiment may be omitted.

Since adjacent memory elements share an impurity region in the cell string according to the first embodiment, the memory cells may occupy a smaller area than those of conventional working memories. As a result, the integration may be improved at the degree of 1.5 times as that of conventional working memories.

Second Embodiment

A spin FET memory according to a second embodiment will be described with reference to FIGS. 10 to 12.

The spin FET memory according to the second embodiment includes a plurality of cell strings according to the first embodiment, which are arranged in a row direction.

Figure 10:
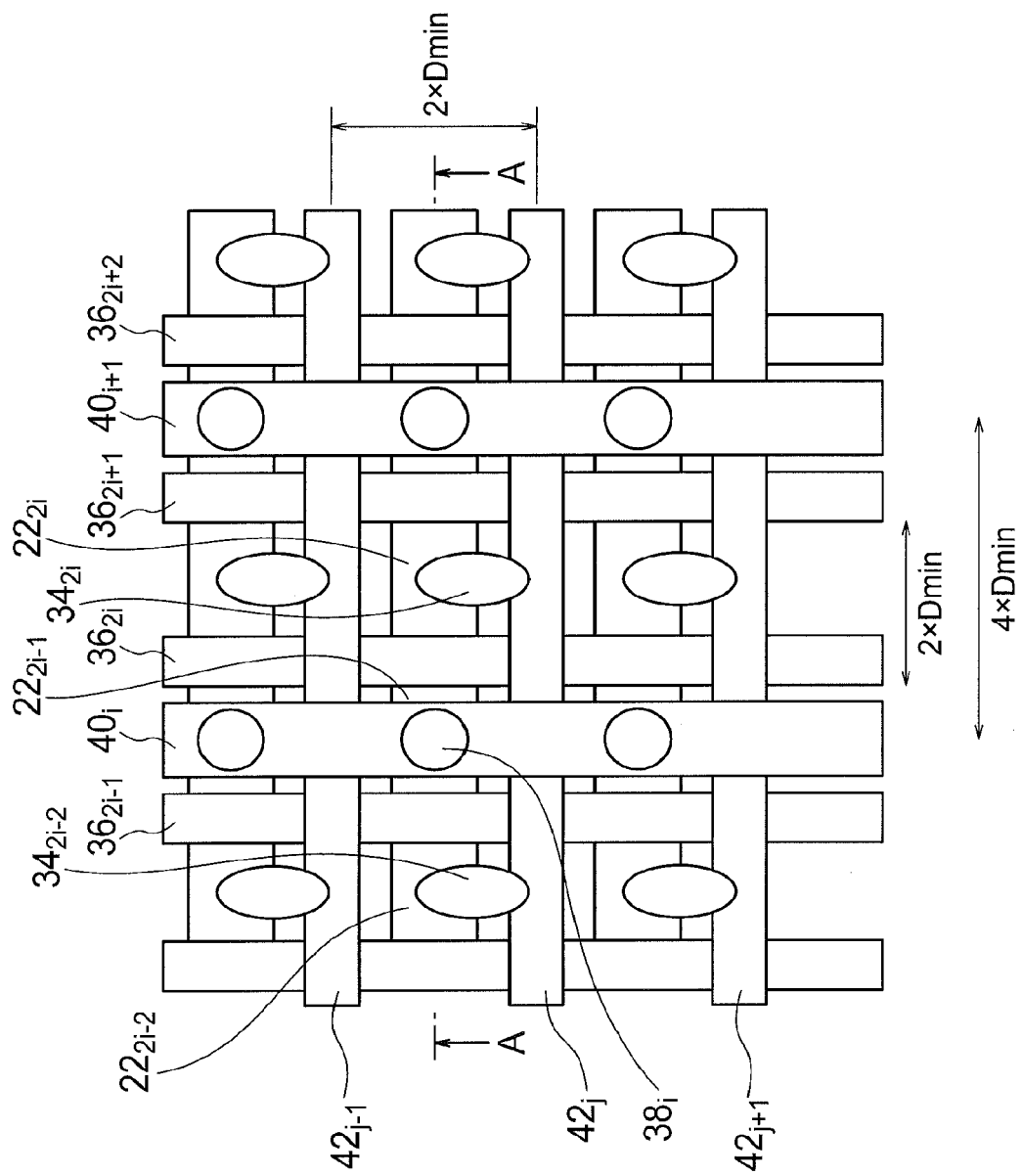
FIG. 10 is a top view of a memory cell array including a spin-based FET memory according to a second embodiment.
Figure 11:
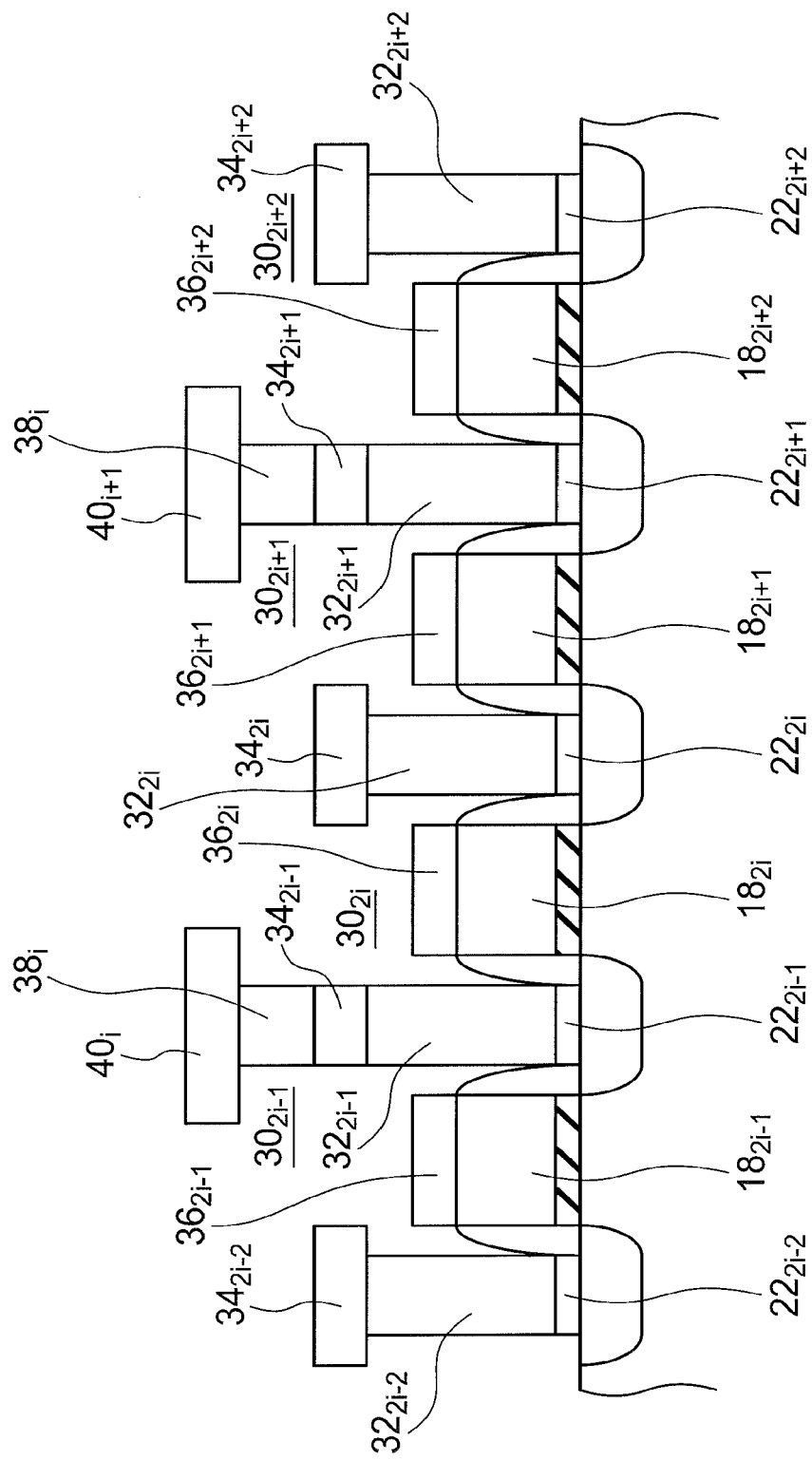
FIG. 11 is a cross-sectional view of the spin-based FET memory according to the second embodiment taken along line A-A shown in FIG. 10.

FIG. 10 shows a top view of the spin-based MOSFET according to the second embodiment, and FIG. 11 shows a cross-sectional view taken along line A-A in FIG. 10. The nonmagnetic layer (tunnel barrier) between the magnetization free layer and the impurity region is not illustrated in FIG. 11.

In FIG. 10, word lines $40_i$, $40_{i-1}$ extend in a column direction, and bit lines $44_{j-1}$, $42_j$, $42_{j+1}$ extend in a row direction, i and j being natural numbers. As a result, the word lines $40_i$, $40_{i-1}$ intersect the bit lines $42_{j-1}$, $42_j$, $42_{j+1}$.

As shown in FIGS. 10 and 11, a magnetization free layer $22_{2i-2}$ of an even-numbered (2i-2) memory cell $30_{2i-2}$ in a cell string in a j-th row is connected to the bit line $42_j$ via a contact $32_{2i-2}$ and a contact $34_{2i-2}$, i and j being natural numbers. The 0-th memory cell $30_0$ includes the impurity region $14_0$ and the magnetization free layer $22_0$ shown in FIG. 3. A magnetization free layer $22_{2i-1}$ of an odd-numbered memory cell $30_{2i-1}$ is connected to the word line $40_i$ via a contact $32_{2i-1}$, a contact $34_{2i-1}$, and a contact $38_i$. In order to reduce the wiring resistance, a gate line $36_{2i}$ is disposed immediately above the gate $18_i$ of each memory cell $30_i$. The gates may be formed of a metal so that the gates and the gate lines may be formed unitedly.

Although the magnetization free layers of even-numbered memory cells are connected to the bit lines and the magnetization free layers of odd-numbered memory cells are connected to the word lines in the second embodiment, the magnetization free layers of even-numbered memory cells may be connected to the word lines, and the magnetization free layers of odd-numbered memory cells may be connected to the bit lines.

Assuming that a minimum feature size is Dmin, a memory cell $30_i$ (i=1, . . . ) of the second embodiment including the gate $18_i$ and the magnetization free layer $22_i$ occupies 2×Dmin in the column direction as shown in FIG. 10, and 2×Dmin in the row direction as shown in FIG. 11. This occupies 4×Dmin² as the area of the memory cell. The memory cell area in conventional working memories is 6×Dmin². As a result, the area of the memory cell of the second embodiment is ⅔ times as that of conventional working memories. Thus, the area is reduced from that of the conventional working memories.

The interval between adjacent word lines may be set to be 4×Dmin by using a word line $40_i$ (i=1, . . . ) in the both case applying voltage to the gate $18_{2i-1}$ and applying voltage to the gate $18_{2i}$. This interval is twice the interval between two adjacent bit lines. Thus, the word lines may be formed at an easy process.

(Read Method)

A method of reading data from the cell string will be described below. Data is read in units of cell strings. The read method may be applied to the cell string according to the first embodiment. The method of reading data from a k-th (k=1, . . . ) cell string will be described below.

In order to read the resistance value between the magnetization free layer $22_{2i-2}$ and the magnetization free layer $22_{2i-1}$, voltage is applied to the gate line $36_{2i-1}$ to electrically connect the magnetization free layer $22_{2i-2}$ and the magnetization free layer $22_{2i-1}$, and the resistance value between the bit line $42_k$ and the word line $40_i$ is read. In order to read the resistance value between the magnetization free layer $22_{2i-1}$ and the magnetization free layer $22_{2i}$, voltage is applied to the gate line $36_2$, to electrically connect the magnetization free layer $22_{2i-1}$ and the magnetization free layer $22_{2i}$, and the resistance value between the bit line $42_k$ and the word line $40_i$ is read. In a similar manner, the resistance value between arbitrarily selected adjacent two magnetization free layers is read.

Figure 12:
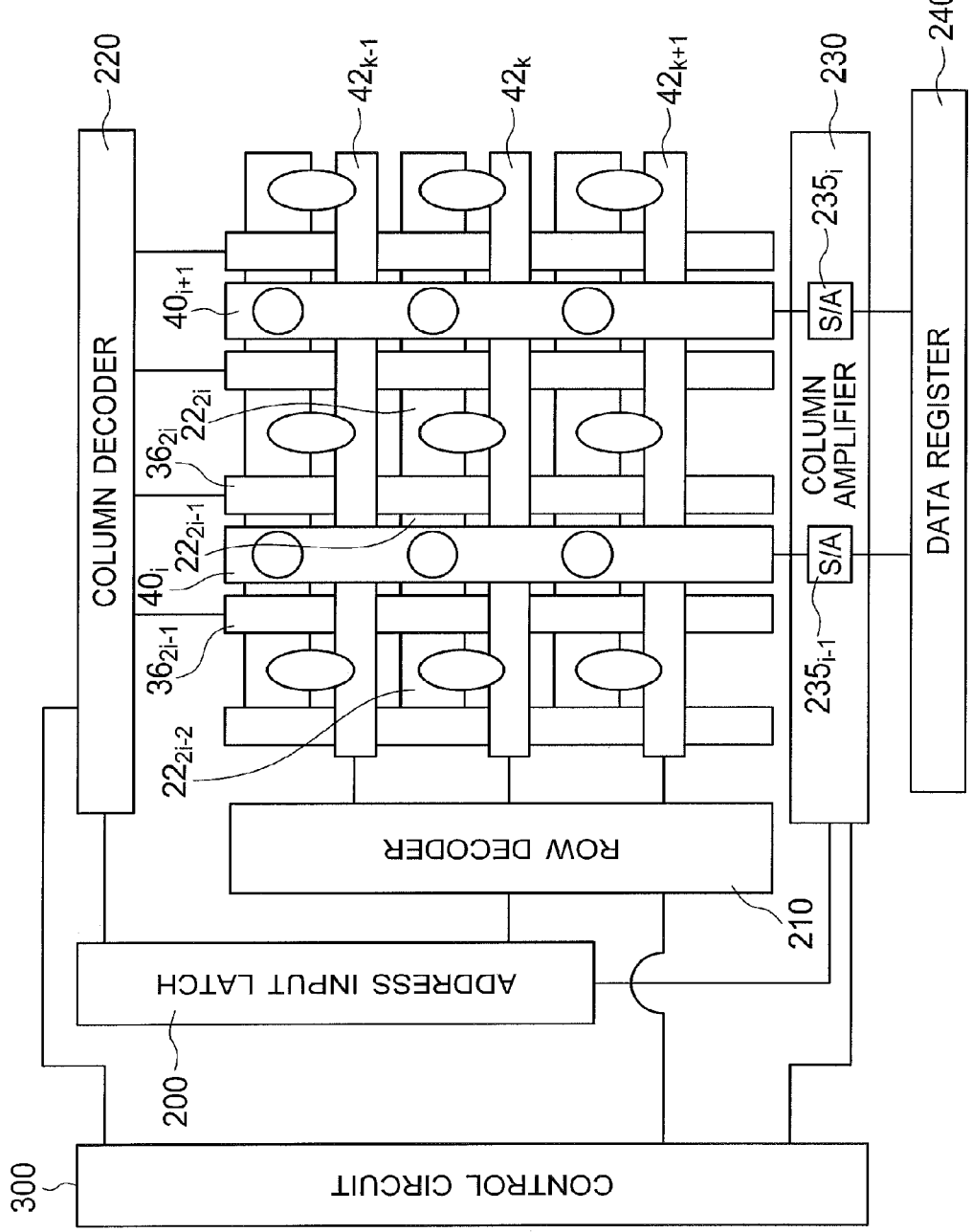
FIG. 12 is a block diagram showing the spin-based FET memory according to the second embodiment.

FIG. 12 shows a circuit for reading data from the spin FET memory.

First, the address of the cell string, from which data is read, for example the k-th (k=1, . . . ) cell string, is inputted to an address input latch 200. The address input latch 200 outputs the column information of the memory cell to be read to a column decoder 220 and a column amplifier 230, and the row information of the memory cell to be read to a row decoder 210.

Next, data of an odd-numbered memory cells $30_{2i-1}$ (i=1, . . . ) of the k-th cell string are simultaneously read in the following manner (see FIG. 11). The column decoder 220 applies voltage to the gate line $36_{2i-1}$ to electrically connect the magnetization free layer $22_{2i-2}$ and the magnetization free layer $22_{2i-1}$, where i is a natural number. The row decoder 210 applies voltage Vb to the bit line $42_k$ to be read, and the column amplifier 230 applies electric current Iw to the word line $40_i$. The resistance state value between the magnetization free layer $22_{2i-2}$ and the magnetization free layer $22_{2i-1}$ is determined by means of reading voltage Vw applied to the word line $40_i$ by a sense amplifier (S/A) $235_i$ in the column amplifier 230 at the situation setting the voltage Vb to reference voltage GND, and the electric current Iw to constant current.

The read resistance state value, an output $X_{2i-1}$, is outputted to a data register 240 to be stored there.

Next, data of even-numbered memory cells $30_{2i}$ (i=1, . . . ) in the k-th cell string are simultaneously read in the following manner. The column decoder 220 applies voltage to the gate line $36_{2i}$ to electrically connect the magnetization free layer $22_{2i-1}$ and the magnetization free layer $22_{2i}$.

The row decoder 210 applies voltage Vb to the bit line $42_k$ to be read, and the column amplifier 230 applies electric current Iw to the word line $40_i$. The resistance state value between the magnetization free layer $22_{2i-1}$ and the magnetization free layer $22_{2i}$ is determined by means of reading voltage Vw applied to the word line $40_i$ by the sense amplifier (S/A) $235_i$ in the column decoder 230 at the situation setting the voltage Vb to reference voltage GND, and the electric current Iw to constant electric current.

The read resistance state value, an output $X_{2i}$, is outputted to the data register 240 to be stored there.

As the period from the time applying the voltages or the electric current to the row decoder 210, the column decoder 220, and the column amplifier 230 to the time outputting to the data register 240 is designated as read time $T_{read}$, the sum of the period of time required for reading the resistance state values $X_{2i-1}$ of all the odd-numbered memory cells and the period of time required for reading the resistance state values $X_{2i}$ of all the even-numbered memory cells, i.e., the period of time required for reading all the memory data in a single cell string is $2 \times T_{read}$. The read operation is performed by means of the control circuit 300 controlling the address input latch 200, the row decoder 210, the column decoder 220, and the column amplifier 230 as shown in FIG. 12.

The pieces of data read from the single cell string are arranged in the data register 240 in the order of $X_1$, $X_2$, . . . , and form a memory value X of the resistance state values. The values of the resistance state may be converted to a memory value Y of the directions of magnetization by, for example, the G-B conversion circuit as shown in FIG. 7, which converts a Gray code to a binary code. One Gray code corresponds to one binary code, and one binary code corresponds to one Gray code. Thus, one-to-one relationship holds between a set of Gray codes and a set of binary codes. The spin FET memory according to the second embodiment is one kind a B-G conversion circuit, and the G-B conversion circuit shown in FIG. 7, for example, is a reverse conversion circuit of the B-G conversion circuit according to the second embodiment.

The area of the memory cells in the second embodiment is about ⅔ times as that of the memory cells in conventional working memories. Therefore, the memory capacity of the chip may be increased to 1.5 times as that of conventional working memories with the same memory cell area. Furthermore, the read time may be suppressed to be about two times as that of conventional spin FET memories.

A single sense amplifier 235 connects to one word line in the second embodiment. In conventional working memories, one sense amplifier connects to one bit line. Thus, the number of sense amplifiers of the second embodiment for the same capacity becomes a half of that of the conventional memories. This may lead to a highly integrated circuit configuration.

The second embodiment has an advantage to decrease the circuit area of decoders and to easily realize highly integrated working memories.

Although the voltage Vb to be applied to the bit line in the read operation is set to be reference voltage GND in the second embodiment, it may be set to be power supply voltage Vdd, or any voltage as long as the voltage outputted to the sense amplifier is stable.

Although a sense amplifier is connected to a word line in the second embodiment, a circuit configuration in which a sense amplifier is connected to a bit line may also be employed.

Although electric current is applied to the word line in the read operation in the second embodiment, voltage may be applied to the word line, and then electric current flowing through the word line may be read to determine the resistance state between the magnetization free layers.

Although voltage is applied to the bit line and electric current is applied to the word line in the read operation in the second embodiment, electric current may be applied to the bit line and voltage may be applied to the word line.

Although the resistance state values $X_i$ are read after the resistance state values $X_{i-1}$ in the second embodiment, the resistance state values $X_i$ may be read before the resistance state values $X_{i-1}$.

Although the magnetization states of the magnetization free layers connected to the bit line to be read are read in two steps, one for odd-numbered memory cells and the other for even-numbered memory cells, in the second embodiment, they may be read in three steps. In this case, related to the numbers j of the j-th (j=1, . . . ) memory cells included in one cell string are divided by three, the memory cells having the numbers with the same remainder are put into the same class and simultaneously read in one step. For example, assuming that p is a natural number, the resistance state values $X_{3p-2}$ (a remainder class of 1) are simultaneously read, the resistance state values $X_{3p-1}$ (a remainder class of 2) are simultaneously read, and the resistance state values $X_{3p}$ (a remainder class of 0) are simultaneously read. Similarly, one cell string may be read in q steps, q being 4 or more.

The second embodiment has a circuit configuration including the address input latch 200 for designating a memory cell to be read, the column decoder 220 for applying voltage to the gate line of the memory cell to be read, the row decoder 210 for applying voltage or electric current to the bit line to which the memory cell to be read is connected, the column amplifier 230 for determining the resistance state value of the memory cell to be read by applying voltage or electric current to the word line to which the memory cell to be read is connected, and the data register 240 for storing the output of the resistance state value. However any circuit configuration obtained by modifying this circuit configuration or replacing it with another circuit configuration having the same function may be employed as long as the magnetization states of the magnetization free layers connected to the bit line to be read can be read in two or more steps.

As described above, the second embodiment may improve the circuit integration like the first embodiment.

Third Embodiment

Figure 13:
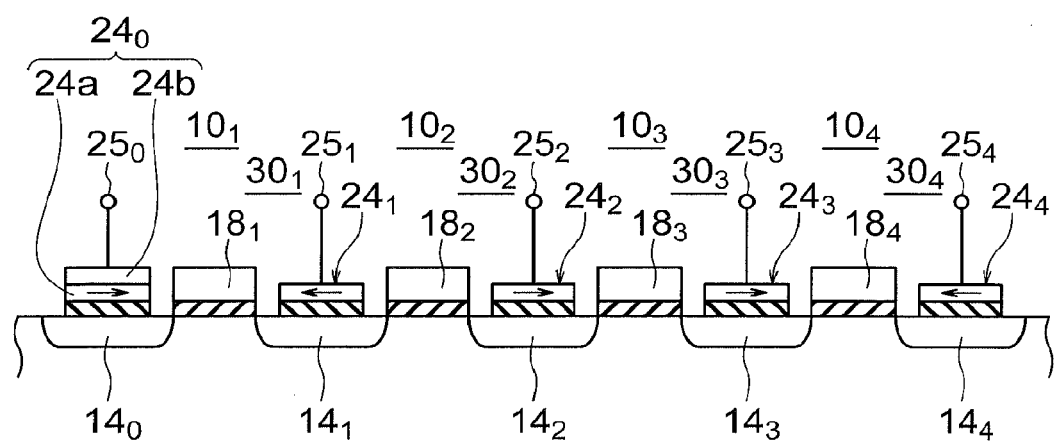
FIG. 13 is a cross-sectional view showing a cell string of spin-based FETs according to a third embodiment.

A spin FET memory according to a third embodiment will be described with reference to FIG. 13, which is a cross-sectional view of a cell string of the spin FET memory according to the third embodiment. The spin-based MOSFET according to the third embodiment is obtained by replacing the magnetization free layers $22_1$-$22_4$ in the first embodiment or second embodiment with magnetization free layers $24_1$-$24_4$ in which the direction of magnetization is parallel to the film plane, and the magnetization free layer $22_0$ with a multilayer structure $24_0$ including a magnetization pinned layer 24a and an antiferromagnetic layer 24b. The antiferromagnetic layer 24b pins the magnetization direction of the magnetization pinned layer 24a in a uniaxial direction in the plane.

The magnetization pinned layer 24a is formed of, for example, CoFe alloy, and the antiferromagnetic layer 24b is formed of, for example, IrMn. After the magnetization pinned layer 24a and the antiferromagnetic layer 24b are stacked, the direction of magnetization of the magnetization pinned layer 24a is pinned by annealing performed in a magnetic field.

The read method and the write method for the third embodiment may be performed in similar manners as those for the first embodiment and the second embodiment.

The third embodiment has an advantageous effect that even if the memory chip is subjected to a high magnetic field and the direction of magnetization of the magnetization pinned layer 24a becomes unstable, the operation for reading the memory is stable since the antiferromagnetic layer 24b in contact with the magnetization pinned layer 24a restores the original direction of magnetization if the memory chip is subjected to a low magnetic field again.

Since the magnetization of the magnetization pinned layer 24a of the third embodiment is not switched by thermal agitation, the operation for reading the memory becomes stable.

Although four memory cells are used in the third embodiment, the number of memory cells may be any integer of two or more.

The third embodiment may improve the circuit integration like the first embodiment and the second embodiment.

Fourth Embodiment

In the first to third embodiments, the reference ferromagnetic layer (magnetization free layer $22_0$ or magnetization pinned layer $24_0$), for which the direction of magnetization is known, is located at the left end of the cell string. However, it may be located at the right end of the cell string. In this case, the resistance states of the memory cells forming the memory value are read from the right, except for the right end ferromagnetic layer, and the most significant bit of the Gray code is the resistance state value $X_1$ of the memory cell located closest to the right end.

The reference ferromagnetic layer may be located at the center of the cell string. In this case, the cell string has a configuration in which memory cells are arranged at both the sides of the ferromagnetic layer. This configuration will be described as a fourth embodiment below.

Figure 14:
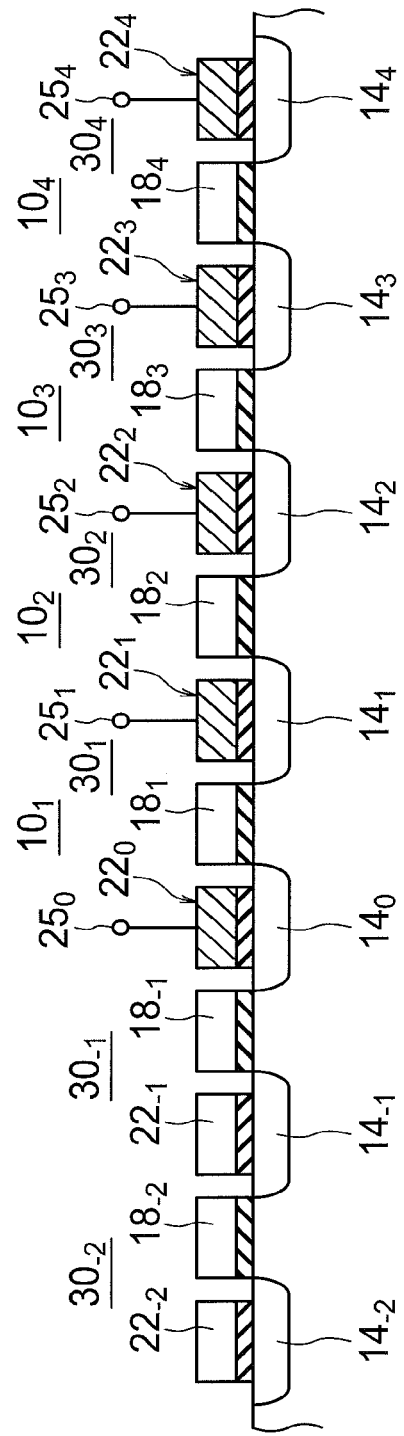
FIG. 14 is a cross-sectional view showing a cell string of spin-based FETs according to a fourth embodiment.

The spin FET memory according to the fourth embodiment is obtained by adding a cell string on the left side of the reference ferromagnetic layer (magnetization free layer $22_0$, or magnetization pinned layer $24_0$) of the spin FET according to any of the first to third embodiments. FIG. 14 is a cross-sectional view of the cell string according to the fourth embodiment. The cell string shown in FIG. 14 is obtained by adding memory cells $30_{-1}$, $30_{-2}$, ... to the left side of the cell string according to the second embodiment shown in FIG. 2. Each memory cell $30_{-i}$ (i=1, 2, ... ) includes a gate $18_{-i}$, an impurity region $14_{-i}$, and a magnetization free layer $22_{-i}$ disposed on the impurity region $14_{-i}$.

Data can be written to and read from the spin FET memory according to the fourth embodiment in the same manner as the second embodiment.

Since another cell string is disposed on the left side of the reference magnetization free layer $22_0$ in the fourth embodiment, a higher integration may be achieved than the second embodiment. Thus, the fourth embodiment has an advantageous effect that a large-capacity working memory may be obtained easily.

Fifth Embodiment

A spin FET memory according to a fifth embodiment will be described below. The spin FET memory according to the fifth embodiment includes the same memory cells as the spin FET memory according to the second embodiment, but data written thereto and read therefrom are different from those of the second embodiment. The write method and the read method are the same as those for the second embodiment.

Figure 15:
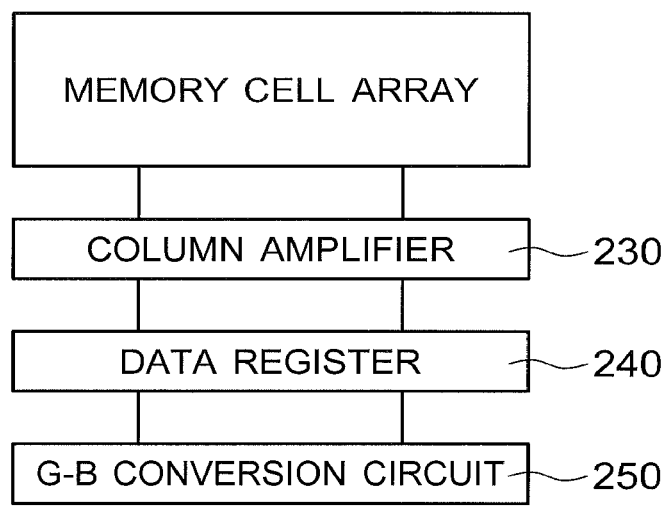
FIG. 15 is a diagram showing an output portion of the spin-based FET memory according to the second embodiment.

In the first embodiment, a memory input value Z is written as a memory value Y of the directions of magnetization, and a value obtained by a G-B conversion of a memory value X of the resistance state values is outputted as a memory output value A. Therefore, the first embodiment includes a G-B conversion circuit (converter) 250 on the output side of the data register 240 as shown in FIG. 15. As described above, the cell string according to any of the first to fourth embodiments have a B-G conversion function, which is reverse to the G-B conversion function of the G-B conversion circuit 250. Therefore, the G-B conversion performed by the G-B conversion circuit 250 after the B-G conversion is performed by the cell string makes an identical transformation. Thus, the input value inputted to the cell string is the same as the output value outputted from the G-B conversion circuit 250. This means that the memory input value Z, the memory value Y of the directions of magnetization, and the memory output value A are the same value in the second embodiment.

Methods of reading data from and writing data to a spin FET memory according to the fifth embodiment will be described below.

Figure 16:
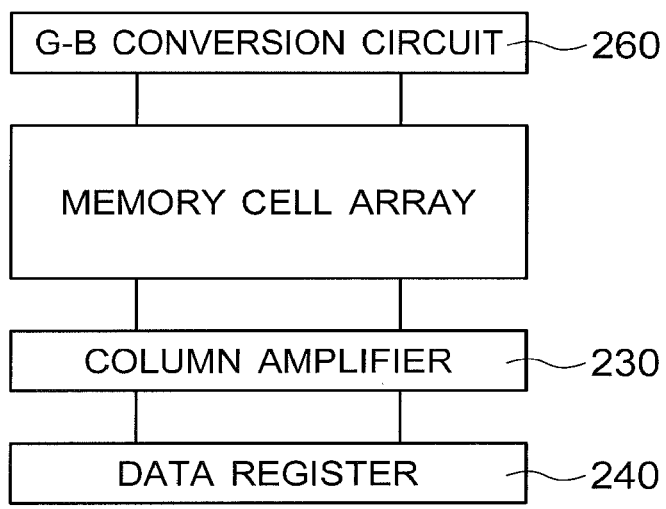
FIG. 16 is a diagram showing an input portion of a spin-based FET memory according to a fifth embodiment.

In the fifth embodiment, the memory value X of the resistance state values is obtained by a B-G conversion, by which a binary code of the memory value Y of the directions of magnetization is converted to a Gray code. Therefore, a G-B conversion circuit (converter) 260 is disposed on the input side of the spin FET memory in the fifth embodiment, as shown in FIG. 16. An identity transformation is also performed in the fifth embodiment if an input value is converted by the G-B conversion circuit 260, and the thus obtained value is further converted by a B-G conversion at the cell string. Thus, the input value inputted to the G-B conversion circuit 260 is the same as the output value outputted from the spin FET memory. Therefore, in the fifth embodiment, the value obtained by a G-B conversion of the memory input value Z to convert the Gray code to the binary code is set as the memory value Y of the directions of magnetization, and the corresponding value $Y_i$ of the direction of magnetization is written to the magnetization free layers $22_i$ (i=1, ... ). The memory value X of the resistance state values is outputted as the memory output value A. Thus, the memory value X of the resistance state values is outputted as the memory output value A without being subjected to any conversion.

In the fifth embodiment, the memory input value Z, the memory value X of the resistance state values, and the memory output value A are equal to each other.

A value corresponding to that of the i-th bit of a memory input value Z inputted to an i-bit (i=1, ... N) memory is set as a corresponding value Z. A value corresponding to that of the i-th bit of the memory value Y of the directions of magnetization is set as a corresponding value $Y_i$ of the direction of magnetization.

Figures 17, 18:
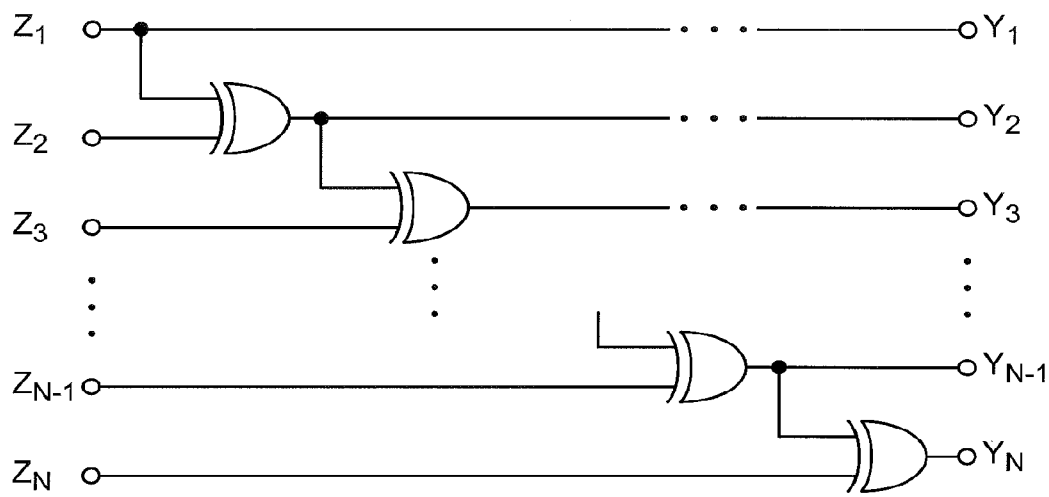
FIG. 17 is a diagram showing a G-B conversion circuit included in the spin-based FET memory according to the fifth embodiment.
FIG. 18 is a diagram showing values of the spin-based FET memory according to the fifth embodiment.

FIG. 17 shows a G-B conversion circuit for obtaining a corresponding value $Y_i$ of the memory value Y of the directions of magnetization from a corresponding value $Z_i$ of the memory input value Z. As described above, this conversion circuit is disposed on the input side of the spin FET memory. The G-B conversion circuit shown in FIG. 17 is capable of producing an N-bit output with N−1 exclusive OR circuits. The G-B conversion circuit performs a G-B conversion on N memory cells with the N−1 exclusive OR circuits. The G-B conversion is performed immediately after a signal is inputted from outside to the memory chip. Since only N−1 exclusive OR circuits are to be added to one chip, the added circuits are very small in area relative to the entire chip area.

FIG. 18 shows, as a specific example of the fifth embodiment, the memory value Y of the directions of magnetization, the memory value X of the resistance state values, and the memory output value A when the memory input value Z is "1001". As shown in FIG. 18, the memory input value Z and the memory output value A are the same value. In the fifth embodiment, the memory output value A is equal to any memory input value Z.

As described above, according to the fifth embodiment, the read value can be outputted at a high speed since no operation is performed on the memory value of the resistance state values.

The fifth embodiment does not include a circuit for calculating the memory value of the resistance state value during a read operation. Accordingly, the distance between the data register (FIG. 12) storing the memory value X of the resistance state values to the output circuit can be reduced. This shortens the time for conveying signals, and enables the output of the read operation to be obtained at a high speed.

Although the cell string according to the second embodiment is used to describe the fifth embodiment, the cell strings according to the third embodiment and the fourth embodiment may also be used.

The fifth embodiment may improve the circuit integration like the second embodiment.

Sixth Embodiment

A spin FET memory according to a sixth embodiment will be described below.

The spin FET memory according to the sixth embodiment includes the same memory cells as the spin FET memory according to the second embodiment, but data written thereto and read therefrom are different from those of the second embodiment. The write method and the read method are the same as those for the first embodiment.

In the first embodiment, a memory input value Z is written as a memory value Y of the directions of magnetization, and a value obtained by a G-B conversion of a memory value X of the resistance state values is outputted as a memory output value A. Therefore, in the second embodiment, the memory input value Z, the memory value Y of the directions of magnetization, and the memory output value A are equal to each other.

In contrast, in the sixth embodiment, the memory value X of the resistance state values is obtained by a B-G conversion for converting a binary code to a Gray code performed on the memory value Y of the directions of magnetization. Therefore, in the six embodiments, the memory input value Z is written as the memory value Y of the directions of magnetization, and the memory value X of the resistance state values is outputted as the memory output value A.

In the first to fifth embodiments, a G-B conversion is performed on the memory value after it is inputted and before it is outputted.

However, no G-B conversion is performed in this period of time in the sixth embodiment.

The memory output value Z is obtained by converting the memory input value A to a Gray code. The memory output value Z is converted to an analog signal and outputted to the outside. The Gray code is suitable for a conversion to an analog signal.

As described above, the sixth embodiment does not need a G-B conversion circuit to output a memory value as an analog output, and is capable of providing a highly integrated memory chip.

Although the cell string according to the second embodiment is used for describing the sixth embodiment, the cell strings of the third embodiment and the fourth embodiment may also be used.

The following materials may be used for the first to sixth embodiments described above.

The gate may be a metal gate formed of a metal material, and the gate insulating film may be formed of a high-k material with a relative dielectric constant of four or more.

The material to be doped to form the p-type semiconductor region may be selected from any or a combination of boron, aluminum, gallium, indium, beryllium, magnesium, palladium, carbon, platinum, gold, and oxygen.

The material to be doped to form the n-type semiconductor region may be selected from any or a combination of phosphorus, arsenic, antimony, sulfur, selenium, titanium, carbon, platinum, gold, and oxygen.

The ferromagnetic layer may be formed of a thin film of at least one metal element selected from the group consisting of Ni, Fe, and Co. It may also be formed of a thin film of a Ni—Fe alloy, a Co—Fe alloy, or a Co—NiCo—Fe—Ni alloy. It may also be formed of a thin film of an amorphous material containing at least one of Co, Fe, and Ni and at least one of Si and B, or an amorphous material containing at least one of Co, Fe, and Ni, at least one of Si and B, and at least one of P, Al, Mo, Nb, and Mn, or an amorphous material containing Co and at least one of Zr, Hf, Nb, Ta, and Ti. Furthermore, a Heusler alloy having a composition close to $X_2YZ$ may also be used to form the ferromagnetic layer, where the X element is Co, the Y element and the Z element is any or a combination of V, Cr, Mn, Fe, Al, Si, Ga, and Ge. The ferromagnetic layer may also be a multilayer film including films of these materials.

The ferromagnetic layer may also be formed of a thin film of a perpendicular magnetization material such as a FePt alloy, a CoPt alloy, a CoCrPt alloy, an alloy containing at least one of Co, Fe, and Ni, at least one of Pt, Ir, Pd, and Rh, and at least one of Cr, Hf, Zr, Ti, Al, Ta, and Nb. Furthermore, the ferromagnetic layer may also be formed of a multilayer film including a layer of at least one of Co and Fe and a layer of at least one of Pt, Ir, and Pd.

A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), and niobium (Nb) may be doped to the ferromagnetic layer to control the magnetic properties, and also various physical properties such as crystallinity, mechanical characteristics, and chemical characteristics.

The tunnel barrier or nonmagnetic layer is formed of an insulating material such as aluminum oxide ($Al_2O_3$), silicon oxide ($SiO_2$), magnesium oxide (MgO), aluminum nitride (AlN), silicon nitride (SiN), bismuth oxide ($Bi_2O_3$), magnesium fluoride ($MgF_2$), calcium fluoride ($CaF_2$), strontium titanate ($SrTiO_3$), lanthanum aluminate ($LaAlO_3$), aluminum oxinitride (Al—N—O), hafnium oxide (HfO), and magnesium aluminum oxide ($MgAl_2O_4$), or a mixture of some of these insulating materials. The nonmagnetic layer may also be formed as a composite film including two or more of these insulating materials.

The tunnel barrier or nonmagnetic layer may also be formed of copper, which may contain an insulating material for current constriction.

The antiferromagnetic layer may be formed of an alloy of iron-manganese (Fe—Mn), platinum-manganese (Pt—Mn), platinum-chromium-manganese (Pt—Cr—Mn), nickel-manganese (Ni—Mn), iridium-manganese (Ir—Mn), or palladium-platinum-manganese (Pd—Pt—Mn). The antiferromagnetic layer may also be formed of nickel oxide (NiO) or iron oxide ($Fe_2O_3$).

The antiferromagnetic layer may also be a composite film having a magnetically coupled multilayer structure of a ferromagnetic material layer, a nonmagnetic material layer, and an antiferromagnetic material layer. The antiferromagnetic layer may also be a film including alternately stacked ferromagnetic material layers and nonmagnetic material layers, which are stacked n times ($n \geq 2$), and an antiferromagnetic material layer.

The semiconductor material may be Si, Ge, GaAs, SiGe, or InGaZnO.

A multilayer structure including a Ti layer, a Pt layer, and a Au layer maybe employed as a gate structure on the GaAs semiconductor.

No gate insulating film may be present between the GaAs semiconductor and the gate.

The material to be doped to form the n-type region in the GaAs semiconductor may be any or a combination of S, Se, Sn, Te, Si, C, and O.

The material to be doped to form the p-type region in the GaAs semiconductor may be any or a combination of Be, Mg, Zn, Cd, Si, C, Cu, and Cr.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A spin transistor memory comprising at least one cell string,
   the at least one cell string including:
      first to n-th ($n \geq 3$) semiconductor regions of a first conductivity type disposed in a semiconductor layer;
      n−1 gates, of which an i-th ($i=1, \ldots, n-1$) gate is disposed above the semiconductor layer between an i-th semiconductor region and an (i+1)-th semiconductor region; and
      n ferromagnetic layers, of which an i-th ($i=1, \ldots, n$) ferromagnetic layer is disposed on the i-th semiconductor region,
   wherein when m is at least one of $1, \ldots, n-1$, a m-th and (m+1)-th ferromagnetic layers having variable magnetization directions exist in the n ferromagnetic layers.

2. The memory according to claim 1, wherein:
   one of the first to the n-th ferromagnetic layer is a k-th ($1 \leq k \leq n-1$) ferromagnetic layer, directions of magnetization of a (k+1)-th ferromagnetic layer to the n-th ferromagnetic layer are expressed as a bit of 0 or 1, depending on whether the directions of magnetization are parallel to or antiparallel to a direction of magnetization of the k-th ferromagnetic layer, and a group of bits in which the bits are arranged from that of the (k+1)-th ferromagnetic layer to that of the n-th ferromagnetic layer is set as a first code;
   resistance values between adjacent ferromagnetic layers from the k-th ferromagnetic layer to the n-th ferromagnetic layer are expressed as a bit of 0 or 1, a group of bits in which the bits are arranged from that of the k-th ferromagnetic layer to the n-th ferromagnetic layer is set as a second code; and
   a conversion from the first code to the second code is a conversion from a binary code to a Gray code.

3. The memory according to claim 2, wherein the one of the first to n-th ferromagnetic layer is the first ferromagnetic layer.

4. The memory according to claim 2, wherein the first code is an input value inputted to the cell string, and the second code is an output value outputted from the cell string.

5. The memory according to claim 4, further comprising a converter configured to convert a Gray code to a binary code, the converter being disposed on an output side of the cell string and receiving the output value as an input.

6. The memory according to claim 4, further comprising a converter configured to convert a Gray code to a binary code, the converter being disposed on an input side of the cell string, and the cell string receiving an output of the converter as the input value.

7. The memory according to claim 1, further comprising a nonmagnetic layer disposed between the i-th semiconductor region and the i-th ferromagnetic layer.

8. The memory according to claim 1, further comprising a control circuit configured to select an j-th ($2 \leq j \leq n-1$) ferromagnetic layer from the first to the n-th ferromagnetic layer of the at least one cell string, and to cause first write current to flow from the j-th ferromagnetic layer to one of the first to an (j−1)-th ferromagnetic layer via the j-th semiconductor region, and to cause second write current to flow between the j-th ferromagnetic layer and one of an (j+1)-th to the n-th ferromagnetic layer via the j-th semiconductor region.

9. The memory according to claim 1, wherein one of the first to the n-th ferromagnetic layer is greater in volume than the others.

10. The memory according to claim 1, wherein n is equal to 4 or more.

11. A spin transistor memory comprising at least one cell string,
   the at least one cell string including:
      first to n-th ($n \geq 3$) semiconductor regions of a first conductivity type disposed in a semiconductor layer;
      n−1 gates, of which an i-th ($i=1, \ldots, n-1$) gate is disposed above the semiconductor layer between an i-th semiconductor region and an (i+1)-th semiconductor region; and
      n ferromagnetic layers, of which an i-th ($i=1, \ldots, n$) ferromagnetic layer disposed on the i-th semiconductor region, wherein a direction of magnetization of one of the first to the n-th ferromagnetic layer is fixed in a predetermined direction, and directions of magnetization of the others are variable, and wherein when m is at least one of 1, . . . , n−1, a m-th and (m+1)-th ferromagnetic layers having variable magnetization directions exist in the n ferromagnetic layers.

12. The memory according to claim 11, wherein n is equal to 4 or more.

13. The memory according to claim 11, wherein:

one of the first to the n-th ferromagnetic layer is a k-th (1≤k≤n−1) ferromagnetic layer, directions of magnetization of a (k+1)-th ferromagnetic layer to the n-th ferromagnetic layer are expressed as a bit of 0 or 1, depending on whether the directions of magnetization are parallel to or antiparallel to a direction of magnetization of the k-th ferromagnetic layer, and a group of bits in which the bits are arranged from that of the (k+1)-th ferromagnetic layer to that of the n-th ferromagnetic layer is set as a first code;

resistance values between adjacent ferromagnetic layers from the k-th ferromagnetic layer to the n-th ferromagnetic layer are expressed as a bit of 0 or 1, a group of bits in which the bits are arranged from that of the k-th ferromagnetic layer to the n-th ferromagnetic layer is set as a second code; and a conversion from the first code to the second code is a conversion from a binary code to a Gray code.

14. The memory according to claim 13, wherein the one of the first to n-th ferromagnetic layer is a first ferromagnetic layer.

15. The memory according to claim 13, wherein the first code is an input value inputted to the cell string, and the second code is an output value outputted from the cell string.

16. The memory according to claim 15, further comprising a converter configured to convert a Gray code to a binary code, the converter being disposed on an output side of the cell string and receiving the output value as an input.

17. The memory according to claim 15, further comprising a converter configured to convert a Gray code to a binary code, the converter being disposed on an input side of the cell string, and the cell string receiving an output of the converter as the input value.

18. The memory according to claim 11, further comprising a nonmagnetic layer disposed between the i-th semiconductor region and the i-th ferromagnetic layer.

19. The memory according to claim 11, further comprising a control circuit configured to select an j-th (2≤j≤n−1) ferromagnetic layer from the first to the n-th ferromagnetic layer of the at least one cell string, and to cause first write current to flow from the j-th ferromagnetic layer to one of the first to an (j−1)-th ferromagnetic layer via the j-th semiconductor region, and to cause second write current to flow between the i-th ferromagnetic layer and one of an (j+1)-th to the n-th ferromagnetic layer via the j-th semiconductor region.

* * * * *